US011465404B2

(12) United States Patent
Hendrikx et al.

(10) Patent No.: US 11,465,404 B2
(45) Date of Patent: Oct. 11, 2022

(54) ON-PRESS PROCESSING OF A UV OR VIOLET-SENSITIZED LITHOGRAPHIC PRINTING PLATE

(71) Applicant: AGFA NV, Mortsel (BE)

(72) Inventors: Peter Hendrikx, Mortsel (BE); Thomas Billiet, Mortsel (BE); Johan Loccufier, Mortsel (BE); Katleen Himschoot, Mortsel (BE); Sue Wilkinson, Mortsel (BE)

(73) Assignee: AGFA Offset BV, Mortsel (BE)

( * ) Notice: Subject to any disclaimer, the term of this patent is extended or adjusted under 35 U.S.C. 154(b) by 0 days.

(21) Appl. No.: 17/312,066

(22) PCT Filed: Dec. 9, 2019

(86) PCT No.: PCT/EP2019/084237
§ 371 (c)(1),
(2) Date: Jun. 9, 2021

(87) PCT Pub. No.: WO2020/120402
PCT Pub. Date: Jun. 18, 2020

(65) Prior Publication Data
US 2022/0032602 A1 Feb. 3, 2022

(30) Foreign Application Priority Data
Dec. 10, 2018 (EP) ..................................... 18211235

(51) Int. Cl.
*B41C 1/10* (2006.01)
*G03F 7/004* (2006.01)
*G03F 7/016* (2006.01)
*G03F 7/029* (2006.01)

(52) U.S. Cl.
CPC .......... *B41C 1/1033* (2013.01); *B41C 1/1016* (2013.01); *G03F 7/0045* (2013.01); *G03F 7/0166* (2013.01); *G03F 7/029* (2013.01); *B41C 2210/04* (2013.01)

(58) Field of Classification Search
None
See application file for complete search history.

(56) References Cited

U.S. PATENT DOCUMENTS

| | | |
|---|---|---|
| 3,042,515 A | 7/1962 | Wainer |
| 3,359,109 A | 12/1967 | Harder et al. |
| 4,139,390 A | 2/1979 | Rauner et al. |
| 4,232,106 A | 11/1980 | Iwasaki et al. |
| 4,258,123 A | 3/1981 | Nagashima et al. |
| 4,336,319 A | 6/1982 | Nagashima et al. |
| 4,425,424 A | 1/1984 | Altland et al. |
| 4,598,036 A | 7/1986 | Iwasaki et al. |
| 5,030,548 A | 7/1991 | Fujikura et al. |
| 5,141,839 A | 8/1992 | Mitchell et al. |
| 5,141,842 A | 8/1992 | Mitchell et al. |
| 2007/0269745 A1 | 11/2007 | Strehmel et al. |
| 2010/0190105 A1* | 7/2010 | Venneman ............ C07C 43/215 430/270.1 |
| 2013/0011791 A1 | 1/2013 | Suzuki et al. |
| 2014/0242517 A1 | 8/2014 | Igarashi et al. |
| 2016/0116841 A1 | 4/2016 | Steenackers et al. |

FOREIGN PATENT DOCUMENTS

| | | |
|---|---|---|
| EP | 0 290 133 A2 | 11/1988 |
| EP | 0 434 968 A2 | 7/1991 |
| EP | 0 605 331 A1 | 7/1994 |
| EP | 2 818 522 A1 | 12/2014 |
| WO | 96/35143 | 11/1996 |
| WO | 2008/145528 A1 | 12/2008 |
| WO | 2008/145529 A1 | 12/2008 |

OTHER PUBLICATIONS

International Search Report dated Mar. 16, 2020 relating to PCT/EP2019/084237, 4 pages.
Written Opinion dated Mar. 16, 2020 relating to PCT/EP2019/084237, 7 pages.

* cited by examiner

*Primary Examiner* — Joshua D Zimmerman
(74) *Attorney, Agent, or Firm* — Leydig, Voit & Mayer, Ltd.

(57) ABSTRACT

A method of lithographic plate making is disclosed wherein a plate precursor is exposed to laser radiation in the wavelength range from 350 to 450 nm, said plate precursor comprising a hydrophilic support and a photopolymerizable or photocrosslinkable image recording layer, and then processed on-press by supplying fountain and ink. The exposure produces a visible image having a 1976 CIELAB color distance $\Delta E$ between exposed and non-exposed areas of at least 2.5.

14 Claims, No Drawings

ON-PRESS PROCESSING OF A UV OR VIOLET-SENSITIZED LITHOGRAPHIC PRINTING PLATE

REFERENCE TO RELATED APPLICATIONS

This application is a 371 National Stage Application of PCT/EP2019/084237, filed Dec. 9, 2019, which claims the benefit of European Application No. 18211235.9, filed Dec. 10, 2018, the contents of which are incorporated by reference herein in their entirety.

TECHNICAL FIELD

The invention relates to a method of making a lithographic printing plate by exposing a plate precursor with an ultraviolet and/or violet laser and then carrying out on-press development, wherein a visible image is formed by the exposure step.

BACKGROUND ART

Lithographic printing typically involves the use of a so-called printing master such as a printing plate which is mounted on a cylinder of a rotary printing press. The master carries a lithographic image on its surface and a print is obtained by applying ink to said image and then transferring the ink from the master onto a receiver material, which is typically paper. In conventional lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-abhesive (ink-repelling) areas and during driographic printing, only ink is supplied to the master.

Lithographic printing masters are generally obtained by the image-wise exposure and development of a so-called lithographic printing plate precursor which comprises a heat- or light-sensitive coating on a lithographic support. The exposure of the coating to heat or light, typically by means of a digitally modulated exposure device such as a laser, triggers a (physico-)chemical process, such as ablation, polymerization, insolubilization by cross-linking of a polymer or by particle coagulation of a thermoplastic polymer latex, solubilization by the destruction of intermolecular interactions or by increasing the penetrability of a development barrier layer. Although some plate precursors are capable of producing a lithographic image immediately after exposure, the most popular lithographic plate precursors require wet processing since the exposure produces a difference in solubility or a difference in the rate of dissolution in a developer between the exposed and the non-exposed areas of the coating. In positive working lithographic plate precursors, the exposed areas of the coating dissolve in the developer while the non-exposed areas remain resistant to the developer. In negative working lithographic plate precursors, the non-exposed areas of the coating dissolve in the developer while the exposed areas remain resistant to the developer. Most lithographic plate precursors contain a hydrophobic coating on a hydrophilic support, so that the areas which remain resistant to the developer define the ink-accepting, hence printing areas of the plate while the hydrophilic support is revealed by the dissolution of the coating in the developer at the non-printing areas.

The coating of photopolymer plates typically comprises an image recording layer and a protective overcoat. The image recording layer undergoes a chemical reaction whereby the layer becomes insoluble or non-dispersible in the developing solution through polymerization and/or crosslinking upon exposure to light or heat. As a result, photopolymer plates are negative working: the exposed areas of the image recording layer are resistant to the developer and form the printing areas after development, while the unexposed areas are removed by the developer and thereby form the non-printing areas where the hydrophilic support accepts fountain and repels the ink.

Photopolymer plate precursors can be sensitized to near UV light, in particular to the wavelength range from 350 to 400 nm, to violet light i.e. wavelengths ranging between 400 and 450 nm, to blue, green or red light i.e. wavelengths ranging between 450 and 750 nm, or to near infrared light i.e. wavelengths ranging between 750 and 1500 nm.

The conventional method of making photopolymer plates comprises first an exposure step of the plate precursor with a laser, a pre-heat step to enhance the polymerization and/or crosslinking reaction, a wash step to remove the protective overcoat, an alkaline developing step to remove unexposed areas of the image recording layer, and a rinse and gum step. Over the past years, there is a clear evolution towards simplified workflows wherein the pre-heat step and/or wash step are eliminated and wherein development and gumming are carried out in a single step. Alternatively, on-press processing wherein the plate is mounted on the press and the image is developed by interaction with the fountain and ink that are supplied to the plate during the press run, has attracted interest in the market.

A high visible contrast between the printing and non-printing areas of the image is required in order to enable identification of the plates which represent the different color selections (typically: cyan, magenta, yellow and black) and to enable a good registration (image alignment) of these plates in a multi-color printing press. In addition, a high contrast allows to evaluate the image quality, such as for example image resolution and detail rendering, before mounting the plates on the press. In order to produce such a visible image, conventional plate precursors typically comprise a dye or a pigment in the coating. These colorants provide, after exposure and development, a high contrast between the printing areas which still contain the colorant and the hydrophilic support at non-printing areas where the coating has been removed by the development.

Since colorants only produce a visible image after development of the plate, they have no use when the plate is processed on the printing press: the image quality of the plate cannot be evaluated and the plates which represent the different color separations cannot be discriminated until the plate is mounted on the press and the press is started. As a result, errors can only be detected on the printed copies and in such event the press has to be stopped and the plates replaced, resulting in a significant loss of time and efficiency. In order to enable identification and inspection of on-press processable plates before they are mounted on the press, it is necessary to produce a so-called "print-out image", i.e. an image which is visible immediately after exposure, without development.

A print-out image can be produced by incorporating so-called leuco dyes, i.e. compounds which produce a visible color upon exposure to light or heat, in the coating of the plate precursor. A problem associated with leuco dyes is that the color switch is often reversible, so that the visible image fades within a few hours after exposure. A printer however prefers to prepare and store new plates while the press is printing another job, which requires that the exposed plates show a visible image until they can be mounted on the press.

On-press processable plates which produce a visible print-out image are commercially available, but only for exposure with infrared light (heat). To the applicant's knowledge no such plates are available for exposure with (ultra)violet light. Formation of a print-out image for violet sensitized photopolymer systems has been disclosed in for example U.S. Pat. Nos. 3,359,109; 3,042,515; 4,258,123; 4,139,390; 5,141,839; 5,141,842; 4,336,319; 4,232,106; 4,425,424; 5,030,548; 4,598,036; EP 434 968; and WO 96/35143.

US2014/242517 discloses methods for making a lithographic printing plate by laser exposure in the wavelength range from 250 to 450 nm of a photopolymer plate comprising a UV sensitizer and a diaryliodonium initiator, followed by off-press processing with a suitable developer. The possibility of on-press development is mentioned briefly (par.[0179] and claim 23) but no examples are given and there is no disclosure nor suggestion of the formation of a print-out image. As a result, the user can not identify the plates which have been exposed with different color separations or evaluate the image quality of the plates before they are mounted on the plate cylinders and the printing press has been started.

SUMMARY OF INVENTION

It is therefore an object of the present invention to provide a method of lithographic plate making by laser exposure with near UV or violet light and on-press processing, wherein the plate precursor upon said exposure produces a visible image that has a high contrast between exposed and non-exposed areas. This object is realized by the method defined in claim 1 with preferred embodiments defined in the dependent claims.

The plate precursor used in the present invention produces a visible print-out image which has a contrast expressed as the color distance $\Delta E$ between exposed and non-exposed areas of at least 2.5, measured after the exposure, e.g. 5 minutes thereafter, and prior to any development. The optional pre-heat step may contribute to the formation of the print-out image and is therefore considered herein to be part of the exposure step; as a result, in embodiments wherein a pre-heat step is used, the wording "after the exposure" should be read as "after the pre-heat".

Preferred embodiments produce a higher visible contrast with a $\Delta E$ of at least 3, more preferably at least 5 and most preferably at least 8. The highest contrast can be obtained with photopolymer plate precursors that contain the specific combination of an onium compound, preferably a diaryliodonium compound, as free-radical initiator and a sensitizing dye which is selected from fluorenes and dyes having the general formula Sty-Ar-Sty wherein "Sty" is an optionally substituted styryl group and Ar is an optionally substituted (hetero-)aromatic group which forms a conjugated system with the Sty groups.

Although it is not well understood how the high contrast of the print-out image is produced, a non-limiting explanation has been postulated by the inventors from model coatings which contain no other photoreactive ingredients besides the initiator and the sensitizer: it is presumed that the conjugated system of the sensitizer is extended by coupling with the radical or ionic fragments that are formed upon the laser exposure, thereby producing a bathochromic shift of the absorption peak of the sensitizer and, as a result, an increase of the light absorption in the visible wavelength range.

Preferred embodiments of the present invention provide the additional advantage that the print-out image does not fade much over time. These embodiments produce a visible image having a $\Delta E$ of at least 2, more preferably at least 3 and most preferably at least 5, when measured 24 hours after the exposure. The best results in terms of image fading are obtained with embodiments wherein the binder has a high glass transition temperature.

In preferred embodiments of the present invention plate precursors are used which are daylight stable during at least 2 hours and therefore can be handled without the need for a safe light. A good daylight stability is obtained by using a plate precursor without an overcoat or with a thin overcoat having a coating weight of less than 1.0 g/m$^2$.

DESCRIPTION OF PREFERRED EMBODIMENTS

Definitions $\Delta E$ is the contrast that is defined by the distance in the CIELAB 1976 color space: $\Delta E = (\Delta L^{*2} + \Delta a^{*2} + \Delta b^{*2})^{1/2}$ wherein $\Delta L^*$, $\Delta a^*$ and $\Delta b^*$ are the differences between the L*, a* and b* color coordinates of the exposed areas and the respective color coordinates of the non-exposed areas of the image. A larger $\Delta E$ value indicates a greater contrast of the visible image. A value of 2.5 is the minimum necessary for a basic visual inspection of the image quality of the plate. More information about the CIELAB 1976 color space can be found in e.g. "Colorimetry, CIE 116-1995: Industrial Colour Difference Evaluation", or in "Measuring Colour" by R. W. G. Hunt, second edition, edited in 1992 by Ellis Horwood Limited, England.

The term "aryl" herein is preferably phenyl, benzyl, tolyl, ortho- meta- or para-xylyl, naphthyl, anthracenyl, phenanthrenyl, and/or combinations thereof. The heteroaryl group is preferably a monocyclic or polycyclic aromatic ring comprising carbon atoms and one or more heteroatoms in the ring structure, preferably 1 to 4 heteroatoms, independently selected from nitrogen, oxygen, selenium and sulphur. Preferred examples thereof include an optionally substituted furyl, pyridinyl, pyrimidyl, pyrazoyl, imidazoyl, oxazoyl, isoxazoyl, thienyl, tetrazoyl, thiazoyl, (1,2,3)triazoyl, (1,2,4)triazoyl, thiadiazoyl, thiofenyl group and/or combinations thereof. The optionally substituted heteroaryl is preferably a five- or six-membered ring substituted by one, two or three oxygen atoms, nitrogen atoms, sulphur atoms, selenium atoms or combinations thereof. Examples thereof include furan, thiophene, pyrrole, pyrazole, imidazole, 1,2,3-triazole, 1,2,4-triazole, tetrazole, oxazole, isoxazole, thiazole, isothiazole, thiadiazole, oxadiazole, pyridine, pyridazine, pyrimidine, pyrazine, 1,3,5-triazine, 1,2,4-triazine or 1,2,3-triazine, benzofuran, benzothiophene, indole, indazole, benzoxazole, quinoline, quinazoline, benzimidazole or benztriazole.

The term "alkyl" herein means all variants possible for each number of carbon atoms in the alkyl group i.e. methyl, ethyl, for three carbon atoms: n-propyl and isopropyl; for four carbon atoms: n-butyl, isobutyl and tertiary-butyl; for five carbon atoms: n-pentyl, 1,1-dimethyl-propyl, 2,2-dimethylpropyl and 2-methyl-butyl, etc. Preferably, the alkyl group is a $C_1$ to $C_{20}$-alkyl group; more preferably the alkyl group is a $C_1$ to $C_6$-alkyl group. Most preferably the alkyl is a methyl group. Cycloalkyls include for example, substituted or unsubstituted cyclopropyl, cyclopentyl, cyclohexyl, 4-methylcyclohexyl, and cyclooctyl groups.

The term "substituted", in e.g. substituted alkyl group means that the alkyl group may be substituted by other atoms than the atoms normally present in such a group, i.e. carbon and hydrogen. For example, a substituted alkyl group may include a halogen atom or a thiol group. An unsubstituted alkyl group contains only carbon and hydrogen atoms.

The optional substituents represent an alkyl, cycloalkyl, alkenyl or cyclo alkenyl group, an alkynyl group, an aryl or heteroaryl group, an alkylaryl or arylalkyl group, an alkoxy group such as methoxy, ethoxy, iso-propoxy, t-butoxy, (2-hydroxytetradecyl)oxy, and various other linear and branched alkyleneoxyalkoxy groups; an aryloxy group, a thio alkyl, thio aryl or thio heteroaryl group, a hydroxyl group, —SH, a carboxylic acid group or an alkyl ester thereof, a sulphonic acid group or an alkyl est2.5er thereof, a phosphonic acid group or an alkyl ester thereof, a phosphoric acid group or an alkyl ester thereof, an amino group, a sulphonamide group, an amide group, a nitro group, a nitrile group, a halogen such as fluoro, chloro, or bromo, or a combination thereof.

A suitable alkenyl group herein is preferably a $C_2$ to $C_6$-alkenyl group such as an ethenyl, n-propenyl, n-butenyl, n-pentenyl, n-hexenyl, iso-propenyl, iso-butenyl, iso-pentenyl, neo-pentenyl, 1-methylbutenyl, iso-hexenyl, cyclopentenyl, cyclohexenyl and methylcyclohexenyl group.

A suitable alkynyl group herein is preferably a $C_2$ to $C_6$-alkynyl group; a suitable aralkyl group is preferably a phenyl group or naphthyl group including one, two, three or more $C_1$ to $C_6$-alkyl groups; a suitable alkaryl group is preferably a $C_1$ to $C_6$-alkyl group including an aryl group, preferably a phenyl group or naphthyl group.

A cyclic group or cyclic structure herein includes at least one ring structure and may be a monocyclic- or polycyclic group, meaning one or more rings fused together.

Lithographic Printing Plate Precursor

The lithographic printing plate precursor used in the method of the present invention comprises a hydrophilic support and a coating provided thereon which contains an image recording layer and optionally a water-soluble or dispersible overcoat layer. The coating may also include one or more additional layers, e.g. an undercoat layer located between the support and the image recording layer, which may be designed to increase adhesion of the printing areas of the coating onto the support and/or to facilitate the removal of the non-printing areas of the coating during on-press processing.

Support

The lithographic printing plate precursor used in the present invention comprises a support which has a hydrophilic surface or which is provided with a hydrophilic layer. The support is preferably a grained and anodized aluminum support, well known in the art. Suitable supports are for example disclosed in EP 1 843 203 (paragraphs [0066] to [0075]). The surface roughness, obtained after the graining step, is often expressed as arithmetical mean center-line roughness Ra (ISO 4287/1 or DIN 4762) and may vary between 0.05 and 1.5 µm. The aluminum substrate has preferably an Ra value below 0.45 µm, more preferably below 0.40 µm and most preferably below 0.30 µm. The lower limit of the Ra value is preferably about 0.1 µm. By anodizing the aluminum support, an $Al_2O_3$ layer is formed and the anodic weight (g/m² $Al_2O_3$ formed on the aluminum surface) may vary between 1 and 8 g/m², more preferably between 2 and 3 g/m².

The grained and anodized aluminum support may be subjected to a so-called post-anodic treatment and/or a pore widening treatment. Suitable examples of post-anodic treatment are treatments with polyvinylphosphonic acid or derivatives thereof, with polyacrylic acid, with potassium fluorozirconate or a phosphate, with an alkali metal silicate, or combinations thereof. Alternatively, the support may be treated with an adhesion promoting compound such as those described in EP 1 788 434 in [0010] and in WO 2013/182328. However, for a precursor optimized to be used without a pre-heat step it is preferred to use a grained and anodized aluminum support with a phosphate fluoride post-anodic treatment or without any post-anodic treatment.

Besides an aluminum support, a plastic support, for example a polyester support, provided with one or more hydrophilic layers as disclosed in for example EP 1 025 992 may also be used.

Image Recording Layer

The image recording layer is negative-working and suitable for on-press development, i.e. the unexposed image recording layer is soluble or dispersible in fountain and/or ink, while the exposed image recording layer becomes resistant to fountain and ink due to hardening induced by the exposure and the optional pre-heat. As a result, the non-exposed areas of the layer can be removed from the support by interaction with the ink and/or fountain at the start of the press run and these areas define hydrophilic (non-printing) areas, whereas the exposed areas are not removed from the support and define oleophilic (printing) areas. Hydrophilic areas have a higher affinity for a fountain solution than for an oleophilic ink, while hydrophobic areas have a higher affinity for an oleophilic ink than for a fountain solution. The hydrophilic areas are defined by the support which has a hydrophilic surface or is provided with a hydrophilic layer. The hydrophobic areas are defined by the image recording layer which has been hardened by the exposure and the optional pre-heat.

The hardening of the image recording layer upon exposure is produced by a photopolymerizable and/or photocrosslinkable composition which is sensitized to the wavelength of the laser radiation. The peak sensitivity of the composition may be above 420 nm, but a better daylight stability can be obtained with compositions that have their peak sensitivity at shorter wavelength, preferably not more than 420 nm and more preferably not more than 410 nm. The availability of laser diodes emitting in the near UV, e.g. at 365 or 375 nm, makes compositions having a peak sensitivity outside the visible wavelength range, i.e. below 400 nm, particularly advantageous.

The image recording layer preferably has a coating thickness between 0.2 and 5.0 g/m², more preferably between 0.4 and 3.0 g/m² and most preferably between 0.6 and 2.2 g/m².

Polymerizable or Crosslinkable Composition

The photopolymerizable or photocrosslinkable composition includes a polymerizable or crosslinkable compound, an initiator, a sensitizer and a polymeric binder. The sensitizer-initiator combination is capable of producing a print-out image without the requirement of any other (photo)reactive compounds such as a leuco dye or a photopolymerizable/-crosslinkable compound; said capability can be demonstrated by preparing materials which do not contain any other reactive compounds besides the sensitizer-initiator combination.

In one embodiment, the polymerizable or crosslinkable compound is a monomer or oligomer including at least one epoxy or vinyl ether functional group and the initiator is a Brönsted acid generator capable of generating free acid, optionally in the presence of a sensitizer, upon exposure. Hereinafter the Brönsted acid generator is also referred to as "cationic photoinitiator" or "cationic initiator".

Suitable polyfunctional epoxy monomers include, for example, 3,4-epoxycyclohexylmethyl-3,4-epoxycyclohexane carboxylate, bis-(3,4-epoxycyclohexymethyl) adipate, difunctional bisphenol A-epichlorohydrin epoxy resin and multifunctional epichlorohydrintetraphenylol ethane epoxy resin.

Suitable cationic photoinitiators include, for example, triarylsulfonium and triarylsulfonium hexafluorophosphate or hexafluoroantimonate. It is noted that most cationic initiators are also free radical initiators because, in addition to generating Brönsted acid, they also generate free radicals during light-induced or thermal decomposition.

According to a more preferred embodiment of the present invention, the polymerizable or crosslinkable compound is a monomer or oligomer including at least one terminal ethylenic group, hereinafter also referred to as free-radical polymerizable monomer, and the polymerization initiator is a compound capable of generating free radicals upon exposure, optionally in the presence of a sensitizer, hereinafter said initiator is referred to as "free radical initiator".

Suitable free-radical polymerizable monomers include, for example, multifunctional (meth)acrylate monomers (such as (meth)acrylate esters of ethylene glycol, trimethylolpropane, pentaerythritol, ethoxylated ethylene glycol and ethoxylated trimethylolpropane, multifunctional urethanated (meth)acrylate, and epoxylated (meth)acrylate), and oligomeric amine diacrylates. The (meth)acrylic monomers may also have other double bond or epoxide group, in addition to (meth)acrylate group. The (meth)acrylate monomers may also contain an acidic (such as carboxylic acid) or basic (such as amine) functionality.

Suitable free-radical polymerizable monomers are disclosed in [0042] and [0050] of EP 2 916 171 and are incorporated herein by reference.

Suitable free-radical initiators are described in WO 2005/111727 from page 15 line 17 to page 16 line 11 and EP 1 091 247. Preferred free-radical initiators are for example hexaaryl-bisimidazole compound (HABI; dimer of triarylimidazole), aromatic ketones, onium salts, organic peroxides, thio compounds, keto-oxime ester compounds, borate compounds, azinium compounds, metallocene compounds, active ester compounds and further compounds having a carbon-halogen bond.

Preferred cationic and/or free-radical initiators are diazonium compounds, iodonium salts, sulfonium salts or mixtures thereof. Suitable classes of iodonium salts are optionally substituted diaryl iodonium salts or diheteroaryl iodonium salts. Specific examples of the diaryliodonium salts include diphenyliodonium, 4-methoxyphenyl-4-(2-methylpropyl) phenyliodonium, 4-chlorophenyl-4-phenyliodonium, 4-(2-methylpropyl) phenyl-tolyl iodonium, 4-hexyloxyphenyl-2,4,6-trimethoxyphenyliodonium, 4-hexyloxyphenyl-2,4-diethoxyphenyliodonium, 4-octyloxyphenyl-6-trimethoxyphenyliodonium, bis (4-tert-butylphenyl) iodonium and bis (4-isopropylphenyl) iodonium, 4-octyloxyphenyl phenyliodonium, [4-[(2-hydroxytetradecyl)-oxy]phenyl]phenyliodonium, 4-methylphenyl-4'-hexylphenyliodonium tetraphenylborate, 4-methylphenyl-4'-cyclohexylphenyliodonium, 4-hexylphenyl-phenyliodonium, 4-methylphenyl-4'cyclohexylphenyliodonium, 4-cyclohexylphenyl-phenyliodonium, 2-methyl-4-t-butylphenyl4'-methylphenyliodonium.

Preferred examples of the triarylsulfonium salts include triphenylsulfonium, dial kylphenacylsulfonium, dialkyl-4-hydroxyphenylsulfonium, bis (4-chlorophenyl) phenylsulfonium, triphenylsulfonium benzoyl formate, bis (4-chlorophenyl) phenylsulfonium benzoyl formate, bis (4-chlorophenyl)-4-methylphenylsulfonium bis (4-chlorophenyl)-4-methylphenylsulfonium, tris (4-chlorophenyl) sulfonium, tris 2,4-dichlorophenyl) sulfonium, bis (2,4-dichlorophenyl) phenyl sulfonium and bis (2,4-dichlorophenyl) 4-methoxyphenyl sulfonium. Suitable counter ions of the onium salts are for example $PF_6^-$, $SbF_6^-$, $AsF_6^-$ and $Ph_4B^-$.

The onium salts are preferably present in the coating in an amount between 1 and 25 wt. %, more preferably in an amount between 5 and 20 wt. %, and most preferably in an amount between 10% and 16 wt. %, all based on the total dry weight of the photopolymerizable and/or crosslinkable layer.

The image recording layer may also comprise a co-initiator which is used in combination with a free-radical initiator. Suitable co-initiators for use in the photopolymer coating are disclosed in U.S. Pat. Nos. 6,410,205; 5,049,479; EP 1 079 276, EP 1 369 232, EP 1 369 231, EP 1 341 040, US 2003/0124460, EP 1 241 002, EP 1 288 720 and in the reference book including the cited references: Chemistry & Technology UV & EB formulation for coatings, inks & paints—Volume 3-Photoinitiators for Free Radical and Cationic Polymerisation by K. K. Dietliker—Edited by P. K. T. Oldring—1991—ISBN 0 947798161. Specific co-initiators, as described in EP 107 792, may be present in the image recording layer to further increase the sensitivity. Preferred co-initiators are disclosed in EP 2 916 171 [0051] and are incorporated herein by reference.

Preferred sensitizers are dyes having a light absorption peak between 320 nm and 500 nm, more preferably from 350 to 450 nm, more preferably from 360 to 420 nm. The best daylight stability is achieved with sensitizers that have an absorption peak below 400 nm.

Suitable sensitizers are e.g. fluorenes. More preferred dyes have the general structure Sty-Ar-Sty wherein each "Sty" group is an optionally substituted styryl ($C_6H_5$—CH=CH—) group and Ar is an optionally substituted aromatic or an optionally substituted heteroaromatic group which forms a conjugated system with the Sty groups. The two Sty groups may be the same of different. Examples of Ar are preferably derived from benzene, naphthalene, anthracene, fluorene, biphenyl, carbazole, furan, dibenzofuran, thiophene, dibenzothiophene, dithienothiophene, oxadiazole, thiadiazole, pyridine, pyrimidine and combinations of two or more of these groups which may be the same or different. Dyes wherein Ar is biphenyl or phenyl are the most preferred, and these dyes will be referred to herein as distyryl-biphenyl compounds and distyryl-benzene compounds respectively.

Also mixtures of sensitizers can be used, e.g. mixtures of two or more of the above mentioned dyes, or mixtures of the above dyes with other sensitizers such as thioxanthones, (keto-)coumarines, pyrilium or thiopyrilium dyes.

The overall amount of these compounds is preferably comprised between 0.1 and 25 wt. %, more preferably between 0.5 and 20 wt. % by weight and most preferably between 1.0 and 15 wt. % with respect to the total dry weight of the image recording layer.

Highly preferred sensitizers are distyryl-biphenyl compounds and distyryl-benzene compounds having a structure according to the following Formula's I or II respectively:

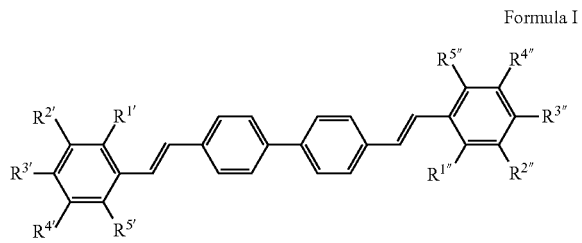

Formula I wherein $R^{1'}$ to $R^{5'}$ and $R^{1'''}$ to $R^{5'''}$ independently represent hydrogen, an alkyl group, an alkoxy group, a cyano group or a halogen;

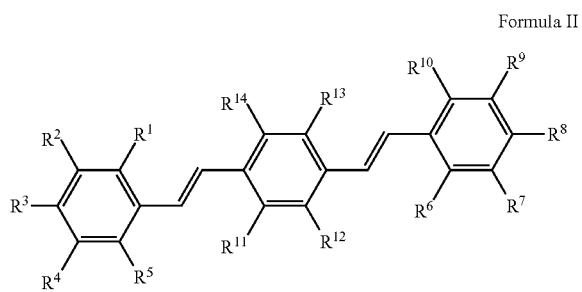

Formula II wherein $R^1$ to $R^{14}$ independently represent hydrogen, an alkyl group, an alkoxy group, a cyano group or a halogen.

One of $R^{1'}$ to $R^{5'}$ or $R^{1'''}$ to $R^{5'''}$ in Formula I preferably represents an alkoxy group having more than 1 carbon atom.

More preferably, $R^{1'}$, $R^{5'}$, $R^{1'''}$, $R^{5'''}$ in Formula I independently represent hydrogen, fluorine, chlorine, $R^{2'}$ to $R^{4'}$ and $R^{2'''}$ to $R^{4'''}$ in Formula I independently represent an alkoxy group; and at least two of the alkoxy groups are branched and have from 3 to 15 carbon atoms.

Even more preferred, $R^{1'}$, $R^{5'}$, $R^{1'''}$, $R^{5}$ in Formula I represent hydrogen and $R^{2'}$ to $R^{4'}$ and $R^{2'''}$ to $R^{4'''}$ in Formula I independently represent an alkoxy group; and at least two of the alkoxy groups are branched and have from 3 to 15 carbon atoms.

Most preferred, $R^{2'}$, $R^{4'}$, $R^{2'''}$, $R^{4'''}$ in Formula I represent a methoxy group and $R^{3'}$ and $R^{3'''}$ in Formula I independently represent branched alkoxy groups having 3 to 15 carbon atoms.

One of $R^1$ to $R^{10}$ in Formula II preferably represents an alkoxy group having more than 1 carbon atom.

More preferably, $R^1$, $R^5$, $R^6$, $R^{10}$, $R^{11}$, $R^{12}$, $R^{13}$ and $R^{14}$ in Formula II independently represent hydrogen, fluorine, chlorine, $R^2$ to $R^4$ and $R^7$ to $R^9$ in Formula II independently represent an alkoxy group; and at least two of the alkoxy groups are branched and have from 3 to 15 carbon atoms.

Even more preferred, $R^1$, $R^5$, $R^6$, and $R^{10}$ in Formula II represent hydrogen and $R^2$ to $R^4$, and $R^7$ to $R^9$ in Formula II independently represent an alkoxy group; and at least two of the alkoxy groups are branched and have from 3 to 15 carbon atoms.

Most preferred, $R^2$, $R^4$, $R^7$ and $R^9$ in Formula II represent a methoxy group and $R^3$ and $R^8$ in Formula II independently represent branched alkoxy groups having 3 to 15 carbon atoms.

The following compounds are examples of highly preferred sensitizers according to Formula I or II:

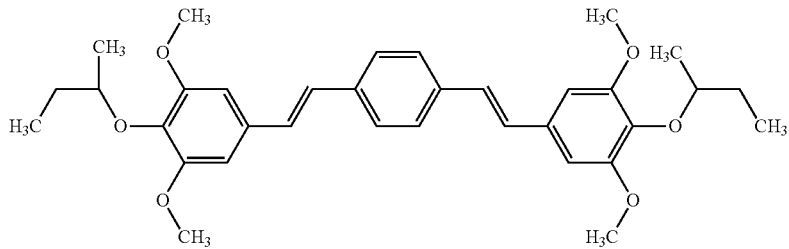

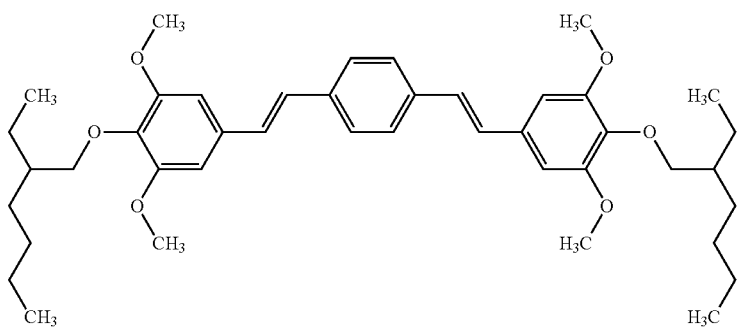

-continued
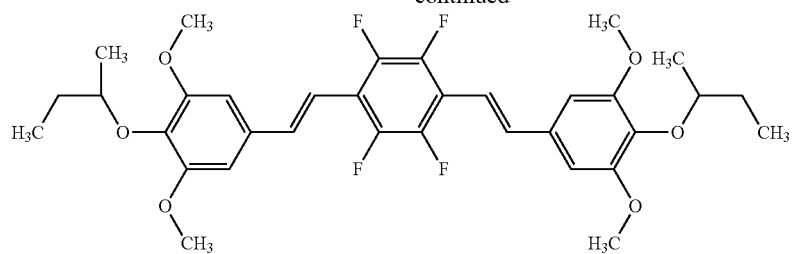
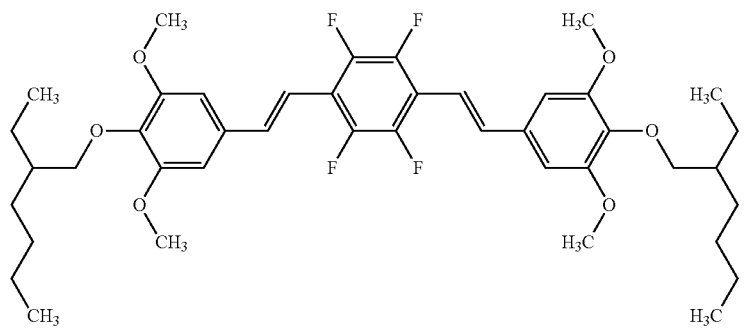
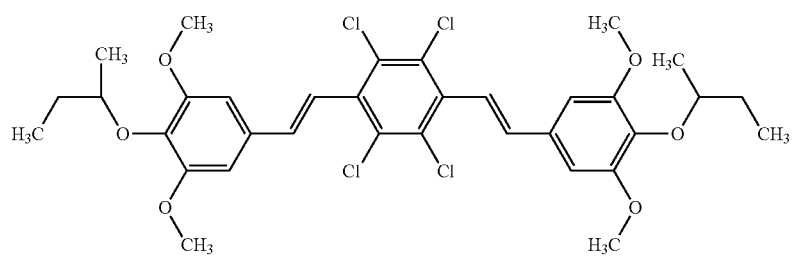
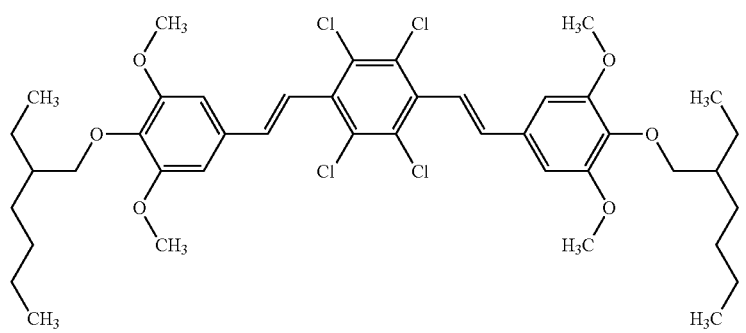
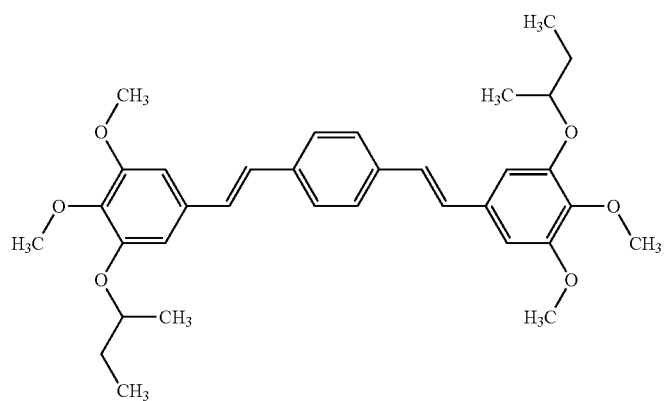

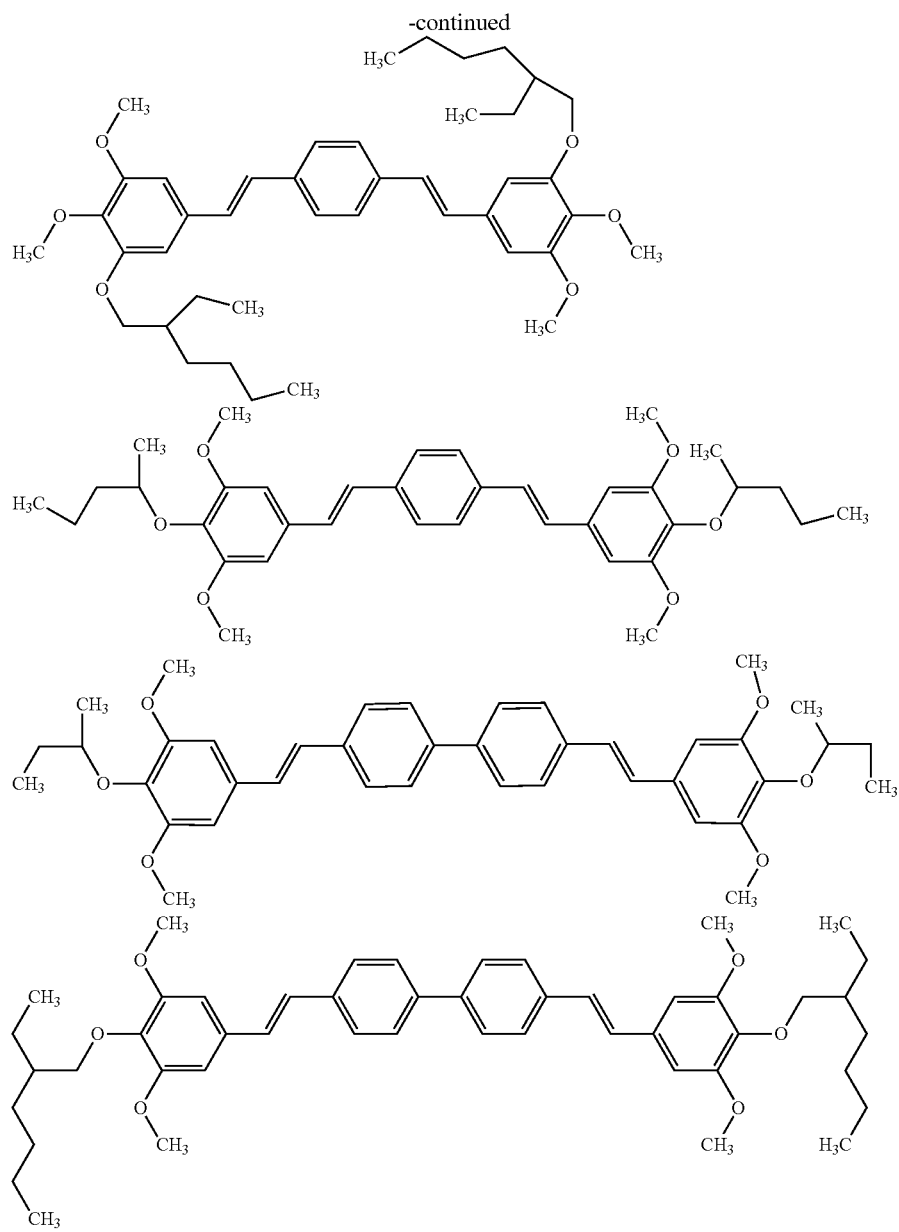

The binder can be selected from a wide series of organic polymers. Mixtures of different binders can also be used. Useful binders are described in WO2005/111727 page 17 line 21 to page 19 line 30, EP1043627 in paragraph [0013] and in WO2005/029187 page 16 line 26 to page 18 line 11.

Binders having a glass transition temperature above room temperature, more preferably above 35° C. and most preferably above 50° C., may be beneficial to prevent fading of the print-out image, because such binders reduce the mobility of the compounds embedded therein, so that the process of image formation is less likely to reverse after the exposure. Preferred examples of such binders are polymers or copolymers comprising monomeric units derived from an optionally substituted (meth)acrylate, an optionally substituted (meth)acrylamide, an optionally substituted styrene or an optionally substituted vinyl naphthalene.

Additional Ingredients of the Image Recording Layer

The image recording layer may also comprise particles which increase the resistance of the coating against manual or mechanical damage. The particles may be inorganic particles, organic particles or fillers such as described in for example U.S. Pat. No. 7,108,956. More details of suitable spacer particles described in EP 2 916 171 [0053] to [0056] are incorporated herein by reference.

The image recording layer may also comprise a polymerisation inhibitor. Particular inhibitors are disclosed in U.S. Pat. No. 6,410,205, EP 1 288 720 and EP 1 749 240.

The image recording layer may further comprise an adhesion promoting compound. The adhesion promoting compound is a compound capable of interacting with the support, preferably a compound having an addition-polymerizable ethylenically unsaturated bond and a functional group capable of interacting with the support. Under "interacting" is understood each type of physical and/or chemical reaction or process whereby, between the functional group and the support, a bond is formed which can be a covalent bond, an ionic bond, a complex bond, a coordinate bond or a hydrogen-bond, and which can be formed by an adsorption process, a chemical reaction, an acid-base reaction, a complex-forming reaction or a reaction of a chelating group or a ligand.

The adhesion promoting compound may be selected from at least one of the low molecular weight compounds or polymeric compounds as described in EPA 851 299 from lines 22 on page 3 to line 1 on page 4, EP-A 1 500 498 from paragraph [0023] on page 7 to paragraph [0052] on page 20, EP-A 1 495 866 paragraph [0030] on page 5 to paragraph [0049] on page 11, EP-A 1 091 251 from paragraph [0014] on page 3 to paragraph [0018] on page 20, and EP-A 1 520 694 from paragraph [0023] on page 6 to paragraph [0060] on page 19. Preferred compounds are those compounds which comprise a phosphate or phosphonate group as functional group capable of adsorbing on the aluminum support and which comprise an addition-polymerizable ethylenic double bond reactive group, especially those described in EP-A 851 299 from lines 22 on page 3 to line 1 on page 4 and EP-A 1 500 498 from paragraph [0023] on page 7 to paragraph [0052] on page 20. Also preferred are those compounds which comprises a tri-alkyl-oxy silane groups, hereinafter also referred to as "trialkoxy silane" groups, wherein the alkyl is preferably methyl or ethyl, or wherein the trialkyloxy silane groups are at least partially hydrolyzed to silanol groups, as functional group capable of adsorbing on the support, especially silane coupling agents having an addition-polymerizable ethylenic double bond reactive group as described in EP-A 1 557 262 paragraph [0279] on page 49 and EP-A 1 495 866 paragraph [0030] on page 5 to paragraph [0049] on page 11. Also the adhesion promoting compounds described in EP 2 916 171 [0058] are incorporated herein by reference.

The adhesion promoting compound may be present in the image recording layer in an amount ranging between 1 and 50 wt. %, preferably between 3 and 30 wt. %, more preferably between 5 and 20 wt. % of the dry weight of the layer.

The adhesion promoting compound may be present in an optional intermediate layer in an amount of at least 25 wt. %, preferably at least 50 wt. %, more preferably at least 75 wt. %, of the dry weight of the layer. Alternatively, the intermediate layer may consist entirely of the adhesion promoting compound.

Various surfactants may be added into the image recording layer to allow or enhance the on-press developability of the precursor.

Leuco dyes may also be present but are not required since sufficient image contrast is produced by the initiator-sensitizer combination of the present invention.

Overcoat

An optional overcoat which acts as an oxygen barrier layer is preferably applied over the image-recording layer, in order to reduce oxygen quenching of radicals and thereby increase the sensitivity of the plate precursor. The overcoat is preferably soluble or dispersible in water so that it is removed easily by the fountain during on-press development. The overcoat preferably adheres sufficiently to the image recording layer or optional other layers of the coating and does not substantially block the transmission of the laser light used during exposure.

Preferred binders of the overcoat are polyvinyl alcohol and the polymers disclosed in WO 2005/029190; U.S. Pat. No. 6,410,205 and EP 1 288 720, including the cited references in these patents and patent applications. The most preferred binder for the overcoat is a polyvinylalcohol having a hydrolysis degree ranging between 74 mole % and 99 mole %, more preferably between 88 mole % and 98 mole %. The viscosity number of the polyvinylalcohol, which is related to the molecular weight and is measured as a 4 wt. % aqueous solution at 20° C. in accordance with DIN 53 015, preferably ranges between 1 and 26, more preferably between 2 and 15, and most preferably between 2 and 10.

The overcoat layer may optionally include other ingredients such as inorganic or organic acids, matting agents or wetting agents as disclosed in EP 2 916 171, incorporated herein by reference.

Contrary to overcoats used in conventional photopolymer plates, the overcoat used in the present invention is preferably kept thin for three reasons, which both relate to the required on-press processability of the plate precursor:

(i) thinner overcoats are in general more readily dissolved or dispersed in the fountain and/or ink.

(ii) a water-soluble overcoat dissolves in the fountain solution; a thick overcoat produces a high amount of dissolved binder which may result in a viscosity increase of the fountain that is sufficient to disturb the lithographic printing process.

(iii) preferred on-press processable plates are sufficiently resistant to daylight, otherwise the non-exposed areas of the image may start hardening before the plate is processed on the press; a thin overcoat allows some oxygen quenching and thereby reduces the sensitivity to daylight; simultaneously, a thinner overcoat also reduces the sensitivity to the laser light used for the image-wise exposure, but that can be compensated by using a higher laser intensity (lower scan speed). More information related to daylight stability is disclosed in the description of the exposure step.

In view of the above mentioned preference for a thin overcoat, its coating weight is preferably less than 1.5 g/m$^2$, more preferably less than 1.0 g/m$^2$ and most preferably less than 0.75 g/m$^2$. The lower limit of the coating weight of the overcoat may be 0.20 g/m$^2$ or even 0.10 g/m$^2$. In highly sensitive embodiments it may even be desired to eliminate the overcoat altogether. The best compromise between scan speed and daylight stability can often be obtained using an overcoat weight from 0.10 to 0.50 g/m$^2$.

Exposure Step and Daylight Stability

The method of the present invention comprises the step of exposing a plate precursor to laser radiation in the wavelength range from 350 to 450 nm, more preferably from 360 to 420 nm and most preferably from 400 to 410 nm. Preferred lasers are laser diodes, in particular a gallium-nitride diode, emitting at 375 nm or 405 nm. Also a frequency-doubled gallium arsenide diode emitting at 410 nm can be used.

Suitable laser imaging equipment is commercially available, e.g. the Prosetter from Heidelberger Druckmaschinen (Germany), Luxel V-8 from FUJI (Japan), Python from Highwater (UK), the Mako series from ECRM (USA), Polaris and Advantage from AGFA (Belgium), LS Jet from Krause (Germany), the XPose! series from Lüscher (Switzerland), and the UV CTP products from Cron (China) and from Amsky (China).

The sensitivity of the plate precursor, defined as the energy density of the laser beam measured at the surface of the coating of the plate, which is necessary to render the image recording layer resistant to fountain and ink, is generally between 0.010 and 200 mJ/cm$^2$, more preferably between 1 and 150 mJ/cm$^2$ and most preferably between 10 and 70 mJ/cm$^2$ Less energy is required if a pre-heat step is applied in order to enhance or speed-up the polymerization and/or crosslinking reaction. A pre-heat involves the heating of the exposed plate precursor before development, typically at a temperature of about 80° C. to 150° C. and preferably during a dwell time of about 5 seconds to 1 minute. The heating element is preferably an IR-lamp, heated air or a heated roll. The pre-heat is typically applied immediately after the laser exposure, so that the amount of radicals or photoacid formed by the exposure is still high.

As explained above, the sensitivity of the plate is highly dependent on the thickness of the overcoat. A thick overcoat provides a very high sensitivity, so that a low energy density below 1 mJ/cm$^2$ is sufficient for image formation, while plate precursors without an overcoat may require a higher energy density, e.g. in the range from 40 to 150 mJ/cm$^2$.

The method of the present invention may be performed in yellow safelight, which does not emit in the wavelength range wherein the image recording layer has a substantial sensitivity. In preferred embodiments, plate precursors are used which are daylight stable during at least 2 hours, i.e. the areas of the image which have not been exposed by the laser remain soluble or dispersible in fountain and/or ink upon exposure to daylight during at least 2 hours. In more preferred embodiments, the precursor is stable to daylight during at least 5 hours and most preferably at least 8 hours. The term "daylight" used herein refers to ambient white light simulated as described in the Examples.

Daylight stable plate precursors can be obtained by using a thin overcoat, as explained above. The thickness of the overcoat can be optimized to obtain a suitable compromise between laser sensitivity and daylight stability: some of the laser sensitivity of the image recording layer is sacrificed by reducing the thickness of the overcoat in order to improve the daylight stability; on the other hand, sufficient laser sensitivity should be retained so as to allow an acceptable laser scan speed, otherwise the exposure step would take too long. The optimum overcoat thickness depends on the specific photopolymerizable or photocrosslinkable composition that is used. Most compositions show the best compromise between daylight stability and scan speed at an energy density between 10 and 150 mJ/cm$^2$, more preferably between 15 and 120 mJ/cm$^2$ and most preferably between 20 and 100 mJ/cm$^2$.

On-Press Processing

Before developing the imaged precursor on a printing press, a pre-rinse step may be carried out, especially for embodiments wherein the precursor has a protective overcoat. This pre-rinse step can be carried out in an off-press apparatus or by manually rinsing the imaged precursor with water. The washing liquid is preferably water, more preferably tap water.

On-press development involves the removal of the non-exposed areas of the image-recording layer from the support by means of fountain and/or ink without essentially removing the exposed areas. The development of the lithographic image is carried out by mounting the exposed precursor on a plate cylinder of a lithographic printing press and rotating the plate cylinder while feeding fountain and/or ink to the precursor. In a preferred embodiment, only fountain is supplied to the plate in the first 60 seconds, more preferably the first 30 seconds and most preferably the first 15 seconds, after the start of the press and then the ink supply is also switched on. In an alternative embodiment, supply of fountain and ink can be started simultaneously or only ink can be supplied during a number of revolutions before switching on the supply of fountain.

EXAMPLES

List of Ingredients

| | |
|---|---|
| Alberdingk U180 | 50 wt. % aqueous dispersion of an aliphatic polyester polyurethane from Alberdingk Boley. |
| Albritect CP 30 | 20 wt. % aqueous dispersion of a copolymer of vinylphosphonic acid and acrylic acid from Rhodia. |
| Elvacite 4026 | solid high molecular weight acrylic resin available from Lucite International. |
| Rucocoat EC 4811 | 30 wt. % aqueous dispersion of an aliphatic polyether polyurethane from Rudolf group. |
| Klucel E | hydroxypropylcellulose from Ashland. |
| Mowiol 4-88 | partially (about 88%) hydrolyzed polyvinylalcohol with M ≅ 27000 from Kuraray. |
| Mowiol 4-98 | fully (about 98%) hydrolyzed polyvinylalcohol M ≅ 31000 from Kuraray. |
| CN 104 | epoxy acrylate oligomer from Arkema. |
| CN-UVE 151M | epoxy diacrylate monomer from Sartomer. |
| FST 510 | diurethane dimethylacrylate from AZ Electronic Materials GmbH. |
| PEGDA | polyethyleneglycol diacrylate oligomer (Mw = 700) from Sigma Aldrich. |
| HABI 1-2 | dimer of a triaryl-imidazole from Hodogaya Chemical having the following formula: |

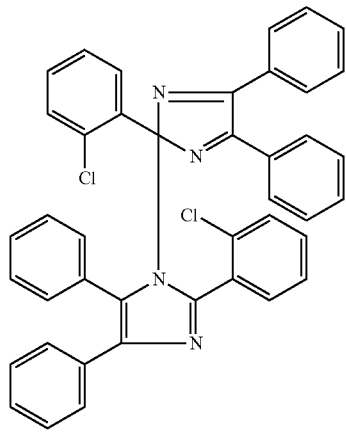 [SMILES: Clc1ccccc1-c1nc(-c2ccccc2)c(-c2ccccc2)n1C1(c2ccccc2Cl)N=C(c2ccccc2)C(c2ccccc2)=N1]
| Fluomix | mixture of the following sensitizers (synthesis described in WO2008/145529): |
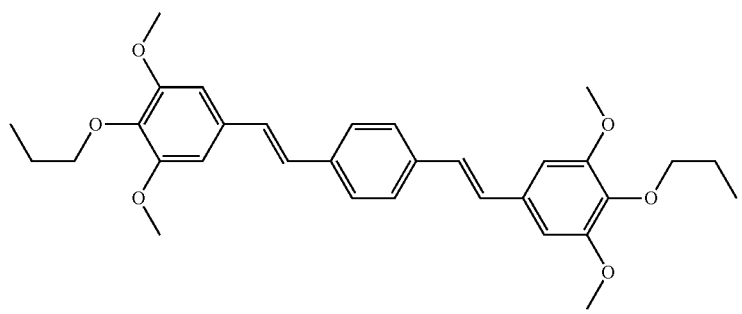
15 wt. %
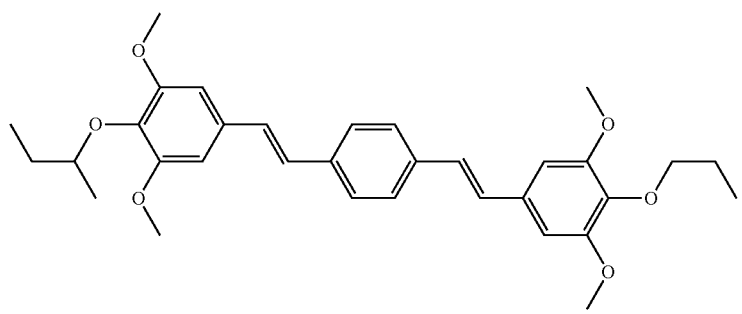
38 wt. %
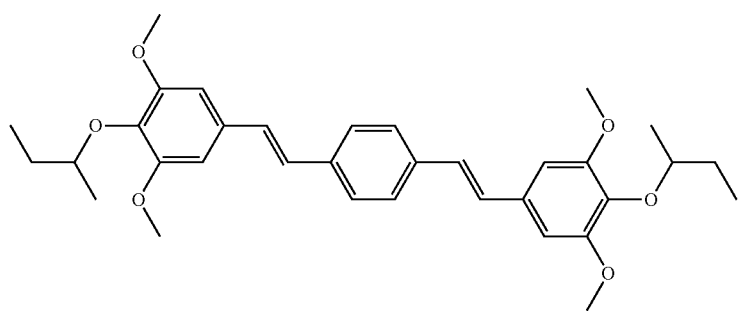
47 wt. %
| Speedcure ITX | thioxantone from Lambson Speciality Chemicals having the following formula: |

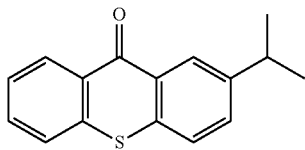 [SMILES: CC(C)c1ccc2sc3ccccc3c(=O)c2c1]

| | |
|---|---|
| DSF | a distryryl-fluorene dye having the following structure: |

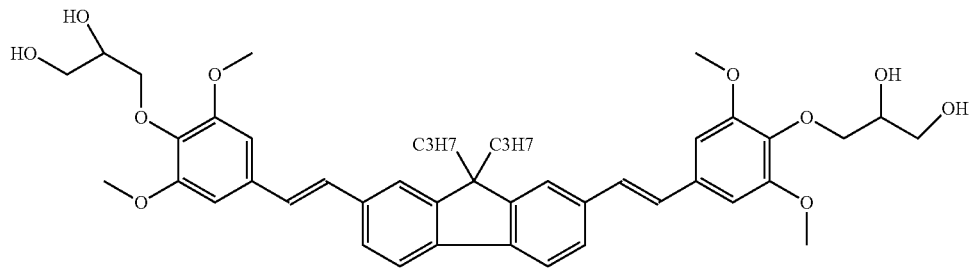

| | |
|---|---|
| Sipomer PAM 100 | methacrylate phosphonic ester from Rhodia. |
| Byk 333 | surfactant from Byk Chemie GmbH. |
| Tegoglide 410 | surfactant from Evonik Tego Chemie GmbH. |
| Disperbyk 182 | wetting and dispersing additive from BYK Chemie GmbH. |
| Lutensol A8 | surface active agent from BASF. |
| Advantage S | dewetting agent from ISP. |
| Ebotec MB-SF | biocide from Bode Chemie Hamburg GmbH. |
| Tergitol 15-S-9 | secondary alcohol ethoxylate from Dow Chemicals. |
| Onium-1 | bis(4-methylphenyl)iodonium hexafluorophosphate from IGM Resins. |
| Onium-2 | (4-methylphenyl,4-isobutylphenyl)iodonium hexafluorophosphate from Sigma Aldrich. |
| Onium-3 | bis(4-tert-butylphenyl)iodonium tetraphenylborate from Hampford Research. |
| Onium-4 | tetrabutylammonium tetraphenylborate from Sigma Aldrich. |
| Onium-5 | Speedcure 992; sulfonium initiator from Lambson Ltd., having the following structure: |

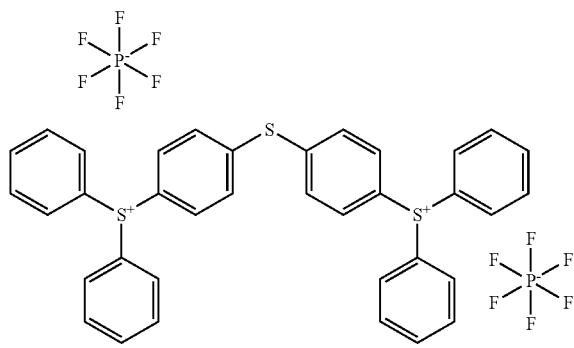 [SMILES: F[P-](F)(F)(F)(F)F ; c1ccc([S+](c2ccccc2)c2ccc(Sc3ccc([S+](c4ccccc4)c4ccccc4)cc3)cc2)cc1 ; F[P-](F)(F)(F)(F)F]

| | |
|---|---|
| Onium-6 | bis (4-t-butylphenyl)iodonium tosylate supplied from Hampford research. |
| Onium-7 | bis(4-t-butylphenyl)iodonium hexafluorophosphate from from Hampford Research. |
| Onium-8 | bis(4-t-butylphenyl)iodonium trifluoromethanesulfonate from Sigma Aldrich. |
| Onium-9 | bis(4-t-butylphenyl)iodonium bis(trifluoromethylsulfonyl)imide from Few Chemicals. |
| Onium-10 | triarylsulfonium hexaflurophosphate supplied from Sigma Aldrich. |
| Onium-11 | (4-octyloxyphenyl,phenyl)iodonium hexafluoroantimonate from Hampford Reasearch. |
| Onium-12 | bis(2,4,6-trimethylphenyl)iodonium triflate from Sigma Aldrich. |
| Onium-13 | (4-t-butylphenyl,4-methoxyphenyl)iodonium hexafluorophosphate from Few Chemicals. |
| Onium-14 | modified sulphonium salt hexafluorophosphate diluted in 25% propylene carbonate from IGM Resins. |

Example 1

The printing plate precursors PP-00 to PP-06 were prepared by coating a solution of the components in Table 1 onto a conventional aluminum support which was electrochemically grained with hydrochloric acid and anodized with sulfuric acid without a further post-anodic treatment. The support had a surface roughness Ra of 0.35-0.40 μm (measured by interferometry) and an aluminum oxide weight of 3.0 g/m$^2$.

The components were dissolved in a mixture of 35 vol. % of methylethylketone and 65 vol. % of 1-methoxy-2-propanol. The coating solution was applied at a wet coating thickness of 30 μm and then dried at 120° C. for 1 minute in a circulation oven. Half of the material so obtained was provided with an overcoat on top of the photosensitive layer by applying a solution in water of the composition defined in Table 2 (wet coating thickness 40 μm) and drying at 120° C. for 2 minutes. The overcoat had a dry coating weight of 1.35 g/m$^2$.

TABLE 1

| components (*) (mg/m$^2$) | PP-00 comp. | PP-01 comp. | PP-02 inv. | PP-03 inv. | PP-04 inv. | PP-05 comp. | PP-06 inv. |
| --- | --- | --- | --- | --- | --- | --- | --- |
| Alberdingk U180 | 120 | 120 | 120 | 120 | 120 | 120 | 120 |
| Tegoglide 410 | 1.5 | 1.5 | 1.5 | 1.5 | 1.5 | 1.5 | 1.5 |
| CN104 | 240 | 240 | 240 | 240 | 240 | 240 | 240 |
| CN-UVE 151M | 90 | 90 | 90 | 90 | 90 | 90 | 90 |
| Monomer (1) | 240 | 240 | 240 | 240 | 240 | 240 | 240 |
| Disperbyk 182 | 45 | 45 | 45 | 45 | 45 | 45 | 45 |
| HABI 1-2 | 3 | 3 | 3 | 3 | 3 | 3 | 3 |
| 2-mercapto-benzimidazole | 21 | 21 | 21 | 21 | 21 | 21 | 21 |
| Sipomer PAM 100 | 225 | 225 | 225 | 225 | 225 | 225 | 225 |
| Albritect CP 30 | 30 | 30 | 30 | 30 | 30 | 30 | 30 |
| Fluomix | 60 | — | 60 | 60 | 60 | 60 | 60 |
| Onium-1 | — | 200 | 200 | — | — | — | — |
| Onium-2 | — | — | — | 200 | — | — | — |
| Onium-3 | — | — | — | — | 200 | — | — |
| Onium-4 | — | — | — | — | — | 200 | — |
| Onium-5 | — | — | — | — | — | — | 200 |
| ΔE with overcoat | <0.5 | 1.87 | 16.07 | 13.34 | 4.25 | 1.17 | 7.72 |
| ΔE without overcoat | <0.5 | 0.58 | 12.60 | 9.65 | 1.79 | 0.31 | 8.92 |

(*) defined above unless specified hereafter:
(1) 30 wt. % solution in MEK of a reaction product from 1 mole of 2-hydroxyethyl-methacrylate and 0.5 mole of 2-(2-hydroxy-ethyl-piperidine);

TABLE 2

| components (*) | g |
| --- | --- |
| Mowiol 4-88 | 0.817 |
| Mowiol 4-98 | 0.493 |
| Ebotec MB-SF | 0.002 |
| Advantage S | 0.027 |
| Lutensol A8 | 0.014 |

(*) defined above.

A solid pattern (100% dots) was exposed on the printing plate precursors PP-00 to -06 with a Lücher Xpose! platesetter (405 nm; no pre-heat) at an energy density of 25 mJ/cm$^2$. The ΔE values were measured on each plate precursor with and without the overcoat, using an X-rite 520 Spectro densitometer calibrated according to the manufacturer's specifications. Each value reported in Table 1 (last two rows) is the average of three measurements at different locations on the plate, carried out 5 minutes after the laser exposure.

The results demonstrate that the combination of initiator and sensitizer needs to be present to produce a sufficient contrast. The compound Onium-4, which is an aliphatic ammonium salt, is not a functional initiator and does not produce a sufficient contrast, while the sulfonium compound Onium-5 produces a contrast which seems less affected by the presence or absence of the overcoat.

On-press processing was simulated by manually wiping the exposed plates with fountain and ink using a sponge, which produced satisfactory results.

Example 2

The plate precursors PP-07 to -12 were prepared by coating a solution of the components in Table 3 onto a conventional aluminum support which was electrochemically grained with hydrochloric acid and acetic acid, anodized with sulfuric acid and then subjected to a phosphate fluoride post-anodic treatment. The support had a surface roughness Ra of 0.36 (measured with Hommel Tester T1000) and an aluminum oxide weight of 2.2 g/m$^2$. The components of PP-07 to PP-09 were dissolved in a solvent mixture of n-propanol/methylethylketone/water in a weight ratio of 60/20/20. The components of PP-10 to PP-12 were dissolved in 1-methoxy-2-propanol. The coated solutions were dried in an oven at 70° C. for 150 seconds in order to give a dry coating weight of 0.9 g/m$^2$.

On top of the photosensitive layer, a solution in water of the composition defined in Table 4 was coated on each of the printing plate precursors PP-07 to -12, and then dried in an oven at 100° C. for 150 seconds in order to give an overcoat having a dry coating weight of 0.15 g/m$^2$.

TABLE 3

| Components (*) (mg/m²) | PP-07 comp. | PP-08 inv. | PP-09 comp. | PP-10 inv. | PP-11 inv. | PP-12 comp. |
|---|---|---|---|---|---|---|
| PMMA (2) | 378 | 378 | 378 | — | — | — |
| Rucocoat EC4811 | — | — | — | 378 | 378 | 378 |
| CN104 | 270 | — | — | 270 | — | — |
| FST510 | — | 270 | — | — | 270 | — |
| PEGDA | — | — | 270 | — | — | 270 |
| Fluomix | 45 | 45 | 45 | 45 | 45 | 45 |
| Onium-1 | 135 | 135 | 135 | 135 | 135 | 135 |
| Sodium tetraphenyl-borate | 18 | 18 | 18 | 18 | 18 | 18 |
| Byk 333 | 9 | 9 | 9 | 9 | 9 | 9 |
| Sipomer PAM 100 | 54 | 54 | 54 | 54 | 54 | 54 |
| Phosphoric acid | 4.5 | 4.5 | 4.5 | 4.5 | 4.5 | 4.5 |
| Klucel E | 45 | 45 | 45 | 45 | 45 | 45 |
| ΔE 5 min. | 9.87 | 11.09 | 8.87 | 17.54 | 17.72 | 12.73 |
| ΔE 24 hr. | 7.23 | 7.97 | 1.00 | 1.44 | 1.30 | 1.98 |
| #copies for clean-out | <1000 | 25-50 | — | <25 | <25 | — |
| #copies for ink uptake | <25 | <25 | — | <25 | <25 | — |
| #copies run length | >10K | >10K | 0 | >10K | >10K | 0 |

(*) defined above unless specified hereafter:
(2) aqueous dispersion of 21.5 wt. % polymethylmethacrylate (Mw = 670000; average particle size = 102 nm), stabilized with an anionic emulsifier.

TABLE 4

| components (*) | g |
|---|---|
| Mowiol 4-88 | 120 |
| Tergitol 15-S-9 | 7.5 |
| Polyvinylpyrrolidone (3) | 22.5 |

(*) defined above unless specified hereafter:
(3) Mw ≈ 10000, from Sigma Aldrich.

After a 7 day stabilization period, a solid pattern (100% dots) was exposed on each of the samples with a Cron plate-setter UPV-4616G+X+ (405 nm; no pre-heat) at an energy density of 40 mJ/cm² and a rotation speed of 800 rpm. The ΔE values were measured as described above for Example 1. Although a good contrast is obtained with PP-07, -09 and -12, they are indicated as comparative examples because these plates were not on-process processable (see below).

In addition to the ΔE value obtained 5 minutes after exposure, the same plate was remeasured after storage in the dark during 24 hours under ambient temperature and humidity conditions (typically 22±2° C. and 34±2% relative humidity). Both ΔE values are reported in Table 3. All these precursors PP07-12 produced a high contrast immediately after exposure, as demonstrated by the values of ΔE 5 min. PP-07 and -08 are preferred embodiments as they show a good contrast stability, while the ΔE value of the less preferred embodiments PP-10- and -11 has dropped to less than 2 after 24 hours. The image fading might be related to the low glass transition temperature of the binder used in PP10-12 (Rucocoat EC4811: −53.5° C.) compared to the high glass transition temperature of the PMMA latex in PP07-09 (+105° C.). Likewise, the PEGDA monomer used in PP-09 and -012 produces upon exposure a polymerized network which is also characterized by a low glass transition temperature, which may also contribute to the poor contrast stability of these examples.

The on-press developability was tested by mounting the plate precursors, exposed with a test image (Agfa Balanced Screening 200 lpi (2400 dpi) screen ruling) using the same exposure parameters of the Cron setter as mentioned above, on the plate cylinder of a Speedmaster SM74 press from Heidelberger Druckmaschinen AG and starting a press run using Ecopure Magenta ink from Sakata, a fountain solution of 2.75% pH System Plus from Ipagsa Technologies SL in 7% isopropanol, a compressible blanket and offset paper (80 g/m²). The standard automatic press start procedure was used, wherein only fountain is supplied during the first 4 revolutions of the plate cylinder; then the paper transport is initiated followed by a further 2 revolutions with only fountain, and on the 6th revolution the ink rollers are also engaged.

The on-press developability was evaluated by assessing the number of printed copies needed to obtain complete removal ("clean-out") of the non-exposed areas of the image, which is indicated by an optical density of 0.0 on the printed copies. Ink uptake was evaluated by assessing the number of printed copies needed so that the solid parts of the image (i.e. 100% dot areas) attain an optical density of 1.15, indicating excellent ink acceptance by the exposed areas.

After completing and evaluating clean-out and ink uptake, printing continued in order to assess the run length performance of the plates. The printed sheet was inspected every 5000 copies. The end point of the run length of the plate was determined as the number of copies printed when the general image appearance (midtones and solid area of the image) or the 2% highlight dot deteriorated visually using a 5× magnification loop on the printed copies.

The results in Table 3 show that sample PP-07 provided a good and stable image contrast but did not clean-out well on the press. This could be resolved by switching from polymerizable compound CN104 to FST510 (sample PP-08). The samples PP-09 and -12 made with PEGDA, which gave a poor contrast stability, also failed on press: the image did not survive the press start, so clean-out and ink uptake could not be evaluated. Samples PP-10 and -11 performed well on the press but represent less preferred examples of the invention in view of the low contrast stability.

Example 3

The plate precursors PP-13 to -24 were prepared by coating a solution of the components in Table 5 on the same aluminum support as in Example 2. The components were dissolved in 1-methoxy-2-propanol. The coated solutions were dried in an oven at 70° C. for 150 seconds in order to give a dry coating weight of 0.9 g/m². The same overcoat as in Example 2 was also applied on each sample.

TABLE 5

| Components (defined above) (mg/m$^2$) | PP-13 inv. | PP-14 inv. | PP-15 comp. | PP-16 inv. | PP-17 inv. | PP-18 inv. | PP-19 inv. | PP-20 inv. | PP-21 inv. | PP-22 inv. | PP-23 inv. | PP-24 inv. |
|---|---|---|---|---|---|---|---|---|---|---|---|---|
| Elvacite 4026 | 378 | 378 | 378 | 378 | 378 | 378 | 378 | 378 | 378 | 378 | 378 | 378 |
| FST 510 | 270 | 270 | 270 | 270 | 270 | 270 | 270 | 270 | 270 | 270 | 270 | 270 |
| Fluomix | 45 | 45 | 45 | 45 | 45 | 45 | 45 | 45 | 45 | 45 | 45 | 45 |
| Onium-1 | 135 | — | — | — | — | — | — | — | — | — | — | — |
| Onium-6 | — | 135 | — | — | — | — | — | — | — | — | — | — |
| Onium-3 | — | — | 135 | — | — | — | — | — | — | — | — | — |
| Onium-7 | — | — | — | 135 | — | — | — | — | — | — | — | — |
| Onium-8 | — | — | — | — | 135 | — | — | — | — | — | — | — |
| Onium-9 | — | — | — | — | — | 135 | — | — | — | — | — | — |
| Onium-10 | — | — | — | — | — | — | 135 | — | — | — | — | — |
| Onium-11 | — | — | — | — | — | — | — | 135 | — | — | — | — |
| Onium-12 | — | — | — | — | — | — | — | — | 135 | — | — | — |
| Onium-13 | — | — | — | — | — | — | — | — | — | 135 | — | — |
| Onium-5 | — | — | — | — | — | — | — | — | — | — | 135 | — |
| Onium-14 | — | — | — | — | — | — | — | — | — | — | — | 135 |
| Sodium tetraphenyl-borate | 18 | 18 | 18 | 18 | 18 | 18 | 18 | 18 | 18 | 18 | 18 | 18 |
| Byk 333 | 9 | 9 | 9 | 9 | 9 | 9 | 9 | 9 | 9 | 9 | 9 | 9 |
| Sipomer PAM | 54 | 54 | 54 | 54 | 54 | 54 | 54 | 54 | 54 | 54 | 54 | 54 |
| Phosphoric acid | 4.5 | 4.5 | 4.5 | 4.5 | 4.5 | 4.5 | 4.5 | 4.5 | 4.5 | 4.5 | 4.5 | 4.5 |
| Klucel E | 45 | 45 | 45 | 45 | 45 | 45 | 45 | 45 | 45 | 45 | 45 | 45 |
| ΔE 5 min. | 12.7 | 4.96 | 1.21 | 11.93 | 10.86 | 11.65 | 8.74 | 11.42 | 4.32 | 12.74 | 10.29 | 9.84 |
| ΔE 24 hr. | 9.25 | 0.53 | 0.50 | 7.89 | 7.32 | 6.25 | 5.28 | 7.32 | 1.33 | 9.04 | 7.08 | 5.37 |
| #copies for clean-out with standard press start | <25 | <25 | <25 | <25 | <25 | <25 | <25 | <25 | <25 | <25 | 25-50 | 25-50 |
| #copies for clean-out with pre-dampening | — | — | — | — | — | — | — | — | — | — | <25 | <25 |
| #copies for ink uptake | <25 | <25 | <25 | <25 | 25-50 | <25 | <25 | 25-50 | 25-50 | <25 | <25 | <25 |
| #copies run length | >10K | >10K | >10K | >10K | >10K | >10K | >10K | >10K | >10K | >10K | >10K | >10K |

Using the same methods as described for Example 2, the plates were exposed, the ΔE values were measured and the performance on the press was evaluated. Sample PP-15 is a comparative embodiment, since it did not produce the required image contrast (both ΔE values were lower than 2.5). Samples PP-23 and -24 did not clean out well and they were repeated with a manual press start procedure comprising a pre-dampening step instead of the automatic start procedure in Example 2: only fountain was supplied to the plate during 30 seconds and then the ink supply was also switched on. The results in Table 5 demonstrate that the manual press start procedure provided a better on-press processability of the plates than the automatic procedure.

Example 4

The same materials as in Example 3 were prepared using the same aluminum support, image recording layer and overcoat, with the proviso that the amount of the initiator was reduced from 135 to 90 mg/m$^2$, as shown in Table 6.

TABLE 6

| Components (defined above) (mg/m$^2$) | PP-25 inv. | PP-26 comp. | PP-27 comp. | PP-28 inv. | PP-29 inv. | PP-30 inv. | PP-31 inv. | PP-32 inv. | PP-33 inv. | PP-34 inv. | PP-35 inv. | PP-36 inv. |
|---|---|---|---|---|---|---|---|---|---|---|---|---|
| Elvacite 4026 | 378 | 378 | 378 | 378 | 378 | 378 | 378 | 378 | 378 | 378 | 378 | 378 |
| FST 510 | 270 | 270 | 270 | 270 | 270 | 270 | 270 | 270 | 270 | 270 | 270 | 270 |
| Fluomix | 45 | 45 | 45 | 45 | 45 | 45 | 45 | 45 | 45 | 45 | 45 | 45 |
| Onium-1 | 90 | — | — | — | — | — | — | — | — | — | — | — |
| Onium-6 | — | 90 | — | — | — | — | — | — | — | — | — | — |
| Onium-3 | — | — | 90 | — | — | — | — | — | — | — | — | — |
| Onium-7 | — | — | — | 90 | — | — | — | — | — | — | — | — |
| Onium-8 | — | — | — | — | 90 | — | — | — | — | — | — | — |
| Onium-9 | — | — | — | — | — | 90 | — | — | — | — | — | — |
| Onium-10 | — | — | — | — | — | — | 90 | — | — | — | — | — |
| Onium-11 | — | — | — | — | — | — | — | 90 | — | — | — | — |
| Onium-12 | — | — | — | — | — | — | — | — | 90 | — | — | — |
| Onium-13 | — | — | — | — | — | — | — | — | — | 90 | — | — |
| Onium-5 | — | — | — | — | — | — | — | — | — | — | 90 | — |
| Onium-14 | — | — | — | — | — | — | — | — | — | — | — | 90 |
| Sodium tetraphenyl-borate | 18 | 18 | 18 | 18 | 18 | 18 | 18 | 18 | 18 | 18 | 18 | 18 |
| Byk 333 | 9 | 9 | 9 | 9 | 9 | 9 | 9 | 9 | 9 | 9 | 9 | 9 |
| Sipomer PAM | 54 | 54 | 54 | 54 | 54 | 54 | 54 | 54 | 54 | 54 | 54 | 54 |
| Phosphoric acid | 4.5 | 4.5 | 4.5 | 4.5 | 4.5 | 4.5 | 4.5 | 4.5 | 4.5 | 4.5 | 4.5 | 4.5 |
| Klucel E | 45 | 45 | 45 | 45 | 45 | 45 | 45 | 45 | 45 | 45 | 45 | 45 |

TABLE 6-continued

| Components (defined above) (mg/m²) | PP-25 inv. | PP-26 comp. | PP-27 comp. | PP-28 inv. | PP-29 inv. | PP-30 inv. | PP-31 inv. | PP-32 inv. | PP-33 inv. | PP-34 inv. | PP-35 inv. | PP-36 inv. |
|---|---|---|---|---|---|---|---|---|---|---|---|---|
| ΔE 5 min. | 9.41 | 2.39 | 0.31 | 8.08 | 6.71 | 8.14 | 6.20 | 7.97 | 6.10 | 8.41 | 7.11 | 8.60 |
| ΔE 24 hr. | 6.24 | 0.46 | 0.90 | 4.78 | 2.91 | 4.03 | 3.27 | 4.25 | 2.66 | 5.70 | 4.41 | 5.04 |
| #copies for clean-out with standard press start | <25 | <25 | 100-1000 | 50 | 25-50 | 25-50 | 25-50 | <25 | 25-50 | <25 | 50-100 | 25-50 |
| #copies for clean-out with pre-dampening | — | — | <25 | <25 | <25 | <25 | <25 | — | <25 | <25 | <25 | <25 |
| #copies for ink uptake | <25 | <25 | <25 | <25 | <25 | <25 | <25 | <25 | <25 | <25 | <25 | <25 |
| #copies run length | >10K | >10K | >10K | >10K | >10K | >10K | >10K | >10K | >10K | >10K | >10K | >10K |

Using the same methods as described for Example 2 and 3, the plates were exposed, the ΔE values were measured and the on-press performance was evaluated. Samples PP-26 and -27 represent comparative embodiments, since they did not produce the required image contrast (both ΔE values were lower than 2.5). The results in Table 6 show again that samples which did not clean well in the automatic press start, showed a much better on-press processability with the manual procedure involving a pre-dampening step.

Example 5

In this Example, the daylight stability of the above described samples PP-16 and PP-28 was tested. First, both plate precursors were image-wise exposed using the same laser scanning conditions as in Example 2 and then subjected to the light emitted by a series of Philips TL-D90 18 W/950 lamps from Signify, which provided a light intensity of 400±20 lux, measured at the surface of the coating of the plates. Said lamps simulate daylight (color code=950; correlated color temperature=5300K) and have a high color rendering index (95) which makes them very suitable for the printing industry to check the quality of printed material.

As shown in Table 7, PP-16 required more than 1000 copies to clean the plates in the automatic press start procedure. Due to its lower content of the onium initiator, PP-28 cleaned significantly faster although some parts of the image required more copies than others. Both samples cleaned well using the manual press start procedure with a pre-dampening step.

TABLE 7

| | PP-16 | | PP-28 | |
|---|---|---|---|---|
| daylight exposure | 60 min. | 120 min. | 60 min. | 120 min. |
| #copies for clean-out with standard press start | >1000 | >1000 | 100-1000 | 100-1000 |
| #copies for clean-out with pre-dampening | <25 | 25-50 | <25 | <25 |
| #copies for ink uptake | 25-50 | 25-50 | 25-50 | 25-50 |
| #copies run length | >5000 | >5000 | >5000 | >5000 |

Example 6

The plate precursors PP-37 to -46 were prepared by coating a solution of the components in Table 8 on the same aluminum support as in Example 2. The components were dissolved in 1-methoxy-2-propanol. The coated solutions were dried in an oven at 70° C. for 150 seconds in order to give a dry coating weight of 0.9 g/m². The same overcoat as in Example 2 was also applied on each sample.

TABLE 8

| Components (defined above) (mg/m²) | PP-37 comp. | PP-38 comp. | PP-39 comp. | PP-40 comp. | PP-41 comp. | PP-42 comp. | PP-43 comp. | PP-44 inv. | PP-45 inv. | PP-46 inv. |
|---|---|---|---|---|---|---|---|---|---|---|
| Elvacite 2046 | 378 | 378 | 297 | 297 | 400.5 | 400.5 | 400.5 | 319.5 | 319.5 | 319.5 |
| FST510 | 270 | 270 | 270 | 270 | 270 | 270 | 270 | 270 | 270 | 270 |
| Speedcure ITX | 45 | 90 | 45 | 90 | — | — | — | — | — | — |
| DFS | — | — | — | — | 22.5 | 45 | 67.5 | 22.5 | 45 | 67.5 |
| Onium-1 | 54 | 54 | 135 | 135 | 54 | 54 | 54 | 135 | 135 | 135 |
| Sodium tetraphenyl borate | 18 | 18 | 18 | 18 | 18 | 18 | 18 | 18 | 18 | 18 |
| Byk 333 | 9 | 9 | 9 | 9 | 9 | 9 | 9 | 9 | 9 | 9 |
| Sipomer PAM 100 | 54 | 54 | 54 | 54 | 54 | 54 | 54 | 54 | 54 | 54 |
| Phosphoric acid | 4.5 | 4.5 | 4.5 | 4.5 | 4.5 | 4.5 | 4.5 | 4.5 | 4.5 | 4.5 |
| Klucel E | 45 | 45 | 45 | 45 | 45 | 45 | 45 | 45 | 45 | 45 |
| ΔE 5 min. | | | no visible image formed | | | | | 4.13 | 9.41 | 12.39 |
| ΔE 24 hr. | | | no visible image formed | | | | | 1.10 | 2.49 | 3.67 |
| #copies for clean-out with pre-dampening | | | | | | | | <25 | <25 | <25 |
| #copies for ink uptake | | | | | | | | <25 | <25 | <25 |
| #copies run length | | | | | | | | >10K | >10K | >10K |

Using the same methods as described for Example 2 and 3, the plates were exposed, the ΔE values were measured and the on-press performance was evaluated. Comparative examples with plate precursors PP-37 to -43 did not produce a visible image and therefore ΔE was not measured and the on-press performance of these plates was not determined. The results obtained with PP-44 to -46 show that a good visible contrast and acceptable press performance can be obtained with the alternative sensitizer DFS, which is both a fluorene derivative as well as a dye according to the general formula Sty-Ar-Sty defined above.

The invention claimed is:

1. A method of making a lithographic printing plate comprising:
   a) image-wise exposing a lithographic printing plate precursor to laser radiation in the wavelength range of from 350 to 450 nm at an energy density in the range from 1 to 150 mJ/cm$^2$, said printing plate precursor comprising:
      a hydrophilic support;
      a negative-working image recording layer which comprises a polymerizable or crosslinkable compound, an initiator, a sensitizer, and a polymeric binder; and
      optionally, an overcoat;
   thereby producing a visible image consisting of exposed and non-exposed areas which have a CIELAB 1976 color distance ΔE of at least 2.5, wherein the color distance is measured prior to development; and
   b) developing a lithographic printing plate by mounting the plate precursor on a plate cylinder of a lithographic printing press and rotating the plate cylinder while feeding fountain and/or ink to the plate precursor.

2. The method according to claim 1 wherein ΔE is at least 2, measured 24 hours after the exposure, during which 24 hour period the plate precursor is stored in the dark under ambient temperature and humidity conditions.

3. The method according to claim 1 wherein the laser radiation has a wavelength in the range of from 400 to 410 nm.

4. The method according to claim 1 wherein the non-exposed areas remain soluble or dispersible in fountain and/or ink upon exposure to daylight for at least 2 hours.

5. The method according to claim 1 wherein the precursor comprises substantially no leuco dyes.

6. The method according to claim 1 wherein the binder is a polymer having a glass transition temperature of at least 35° C.

7. The method according claim 6 wherein the binder is a polymer or a copolymer comprising monomeric units derived from an optionally substituted (meth)acrylate, an optionally substituted (meth)acrylamide, an optionally substituted styrene, or an optionally substituted vinyl naphthalene.

8. The method according to claim 1 wherein the initiator is an onium salt.

9. The method according to claim 8 wherein the initiator is a diaryliodonium salt.

10. The method according to claim 1 wherein the sensitizer is an optionally substituted fluorene or a dye having the general formula Sty-Ar-Sty wherein Sty is an optionally substituted styryl group and Ar is an optionally substituted (hetero-)aromatic group which forms a conjugated system with the Sty groups.

11. The method according to claim 10 wherein the initiator is a diaryliodonium salt.

12. The method according to claim 1 wherein the sensitizer is a distyryl-biphenyl or distyryl-benzene compound according to Formula I or Formula II, respectively:

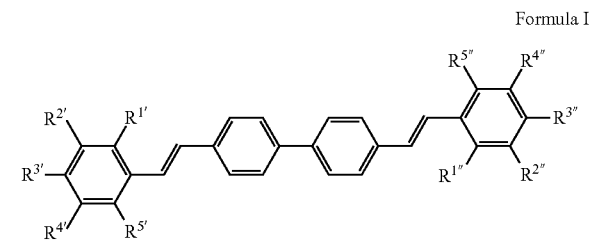

Formula I wherein $R^{1'}$ to $R^{5'}$ and $R^{1''}$ to $R^{5''}$ independently represent hydrogen, an alkyl group, an alkoxy group, a cyano group, or a halogen;

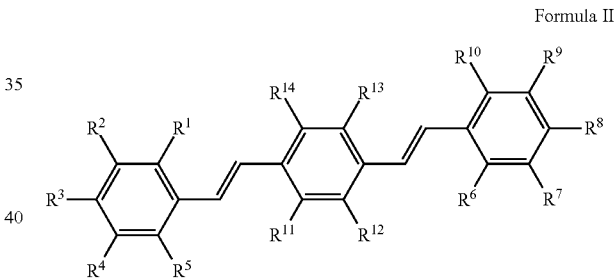

Formula II wherein $R^1$ to $R^{14}$ independently represent hydrogen, an alkyl group, an alkoxy group, a cyano group, or a halogen.

13. The method according to claim 1 wherein the plate precursor comprises no overcoat or comprises an overcoat having a coating weight of less than 1.0 g/m$^2$.

14. The method according to claim 1 wherein step b) is carried out by supplying only fountain to the plate precursor while starting the press and then switching on the ink supply.

* * * * *